United States Patent
Lindemann et al.

(10) Patent No.: US 12,119,614 B2
(45) Date of Patent: Oct. 15, 2024

(54) DEVICE FOR INJECTING SPIN-POLARIZED CHARGE CARRIERS AND FOR REFLECTING LIGHT

(71) Applicant: RUHR-UNIVERSITÄT BOCHUM, Bochum (DE)

(72) Inventors: Markus Lindemann, Mülheim an der Ruhr (DE); Nils Gerhardt, Bochum (DE); Martin Hofmann, Hattingen (DE)

(73) Assignee: RUHR-UNIVERSITÄT BOCHUM, Bochum (DE)

( * ) Notice: Subject to any disclaimer, the term of this patent is extended or adjusted under 35 U.S.C. 154(b) by 1051 days.

(21) Appl. No.: 16/978,757

(22) PCT Filed: Feb. 28, 2019

(86) PCT No.: PCT/EP2019/055009
§ 371 (c)(1),
(2) Date: Sep. 7, 2020

(87) PCT Pub. No.: WO2019/170517
PCT Pub. Date: Sep. 12, 2019

(65) Prior Publication Data
US 2020/0412085 A1    Dec. 31, 2020

(30) Foreign Application Priority Data
Mar. 8, 2018 (DE) ............. 10 2018 105 345.2

(51) Int. Cl.
*H01S 5/042*  (2006.01)
*H01L 33/10*  (2010.01)
(Continued)

(52) U.S. Cl.
CPC .......... *H01S 5/0421* (2013.01); *H01L 33/105* (2013.01); *H01S 5/04252* (2019.08);
(Continued)

(58) Field of Classification Search
CPC ............... H01S 5/0421; H01S 5/04252; H01S 5/04256; H01S 5/0607; H01S 5/18319; H01S 5/18355; H01L 33/105
See application file for complete search history.

(56) References Cited

U.S. PATENT DOCUMENTS

| 5,874,749 A | 2/1999 | Jonker |
| 2006/0186432 A1* | 8/2006 | Osipov ................ H01L 33/02 257/103 |
| 2007/0045114 A1 | 3/2007 | Wang et al. |

FOREIGN PATENT DOCUMENTS

| DE | 10243944 A1 | 4/2004 |
| EP | 1 503 328 A1 | 2/2005 |
(Continued)

OTHER PUBLICATIONS

Machine translation of JP H09246669 A (Year: 1997).*
(Continued)

*Primary Examiner* — Yuanda Zhang
(74) *Attorney, Agent, or Firm* — Jonathan Kidney; Intelink Law Group, P.C.

(57) ABSTRACT

The invention relates to a device (2) for injecting spin-polarized electrons and for reflecting light, comprising at least one lattice structure (3) having a plurality of recesses (4), wherein the lattice structure (3) is designed to reflect the light, and wherein a respective injection contact (5, 6) for injecting spin-polarized electrons is arranged in at least some of the recesses (4).

19 Claims, 2 Drawing Sheets

(51) Int. Cl.
*H01S 5/06* (2006.01)
*H01S 5/183* (2006.01)
(52) U.S. Cl.
CPC ........ *H01S 5/04256* (2019.08); *H01S 5/0607* (2013.01); *H01S 5/18319* (2013.01)

(56) References Cited

FOREIGN PATENT DOCUMENTS

| | | | | |
|---|---|---|---|---|
| JP | 06260725 A | | 9/1994 | |
| JP | H09246669 A | * | 9/1997 | ............... H01S 3/18 |
| WO | WO2007045114 | | 4/2007 | |

OTHER PUBLICATIONS

T. Czyszanowski et al., Subwavelength Grating as Both Emission Mirror and Electrical Contact for VSFLs in any Material System; Scientific Reports; 7:40348/DOI: 10.1038/srep40348; www.nature.com/scientificreports.

* cited by examiner

DEVICE FOR INJECTING SPIN-POLARIZED CHARGE CARRIERS AND FOR REFLECTING LIGHT

CROSS-REFERENCE TO RELATED APPLICATION(S)

This is a national stage application claiming the priority and benefit of PCT application PCT/EP2019/055009 filed Feb. 28, 2019, claiming priority to DE application no. 10 2018 105 345.2 filed Mar. 8, 2018, the contents of which are hereby incorporated by reference in their entirety.

FIELD

The invention relates to a device for injecting spin-polarized charge carriers and for reflecting light. The device can in particular be a spin injector for a surface emitting laser diode. The invention further relates to an arrangement having such a device and a method for the operation thereof.

BACKGROUND

The arrangement can in particular be a light-emitting component having a resonator, such as a laser or a resonant LED. The arrangement can in particular be referred to as a "device with cavity." The ever increasing worldwide networking through the Internet requires ever higher data transfer rates. A considerable proportion of the data volume to be transmitted takes place between servers within a data center, such that a considerable proportion of the data volume only has to be transmitted over a comparatively short distance. In particular, data of this type can advantageously be transmitted optically. The lasers used for optical data transmission over short distances, for example between the servers within a data center, should be inexpensive, small, and yet quick to modulate. In conventional systems, intensity-modulated lasers are used for this purpose.

As an alternative to modulating the intensity of a laser, the polarization of the laser light can be modulated, i.e. changed such that the changes in polarization reflect the information to be transmitted. It is advantageous in terms of size and modulation speed if the modulator is integrated in the transmitting laser.

The polarization of the laser light can be controlled by the spin orientation of the charge carriers in a semiconductor laser. The polarization modulation can be carried out faster than an intensity modulation because the resonance frequency determined by material and geometry parameters and assigned to the polarization modulation system can be higher than that of an intensity modulation system. This can be achieved in particular by maximizing the birefringence of the laser material.

Lasers that use the spin property of the charge carriers to control the polarization of the laser light are referred to here as so-called spin lasers. So-called vertical-cavity surface-emitting lasers, called VCSEL for short in the literature, which use the spin property of charge carriers, are referred to as spin-vertical-cavity surface-emitting lasers, or spin VCSEL for short, and in German as Spin-polarisierter oberflächenemittierender Laser.

The publication "Spintronics stretches its arms to lasers" by Jeongsu Lee and Igor Zutic, published in 2012, describes a spin VCSEL, wherein the laser has a conventional structure having an active region, which is arranged between two opposing Bragg mirrors, in the technical literature also called Distributed Bragg Reflector (DBR). The opposing DBRs form a laser resonator. In this arrangement, spin-polarized electrons are introduced into the active region through a spacer which separates the active region from a DBR. The spin state of the spin-polarized charge carriers is determined either by the magnetization of a suitable magnetic spin-injection contact or by alignment in magnetic transport layers. Alignment by an external magnetic field is also possible. A suitable spin-injection contact is typically based on a ferro- or paramagnetic metal layer from which spin-polarized charge carriers are injected into the non-magnetic semiconductor layers of the laser by tunnel processes. If a spin-polarized electron recombines with a depolarized hole, the spin polarization of the electron determines the circular polarization of the light field. In this way, the direction of the circular polarization of the photons generated, that is to say the emission polarization, can be determined by the polarization direction of the spin of the electrons introduced into the active region. There are also materials in which the hole spin is slowly dephasing. In this respect, the use of spin-polarized electrons and unpolarized holes is to be understood by way of example. Electrons and holes can be used as charge carriers.

Spin-polarized electrons have the property that the spin of the electron is lost on the way to the active region of the laser resonator if the way there is too long, i.e. the transport path of the electron into the active region is longer than the so-called spin-relaxation length. The spin-relaxation length also depends on the temperature and a potential magnetic field in the region of the transport path, wherein low temperatures and a correspondingly polarized magnetic field prolong the spin-relaxation length. Conventional applications that use the spin polarization of electrons therefore use very low temperatures of, for example, a few 10 mK and/or strong magnetic fields of a plurality of Tesla to extend the spin-relaxation length, such that the spin polarization of an electron is preserved as long as possible on the transport path. Such low temperatures and such strong magnetic fields cannot be realized in many practical applications.

To ensure that the light field created when an electron is recombined with a hole is polarized, the spin of the spin-polarized electron must not be lost on the transport path until it recombines. Short transport routes are therefore preferred for efficient operation.

BRIEF DESCRIPTION OF THE FIGURES

The invention is explained in more detail below with reference to the figures, in which.

DETAILED DESCRIPTION

The device described can be used in an arrangement, in particular in a laser, for the injection of spin-polarized charge carriers such as electrons and holes and for the reflection of light. The following is based on the injection of spin-polarized holes by way of example.

Spin-polarized electrons can thus be injected into the active region of a laser in such a way that the electrons have to travel a particularly short path homogeneously over the entire active region to recombine with holes and thus to generate light. The laser described can thus also be operated with particularly short spin-relaxation lengths, and thus at comparatively high temperatures and/or low external magnetic fields. It is even possible to completely dispense with external magnetic fields.

Figure 1:
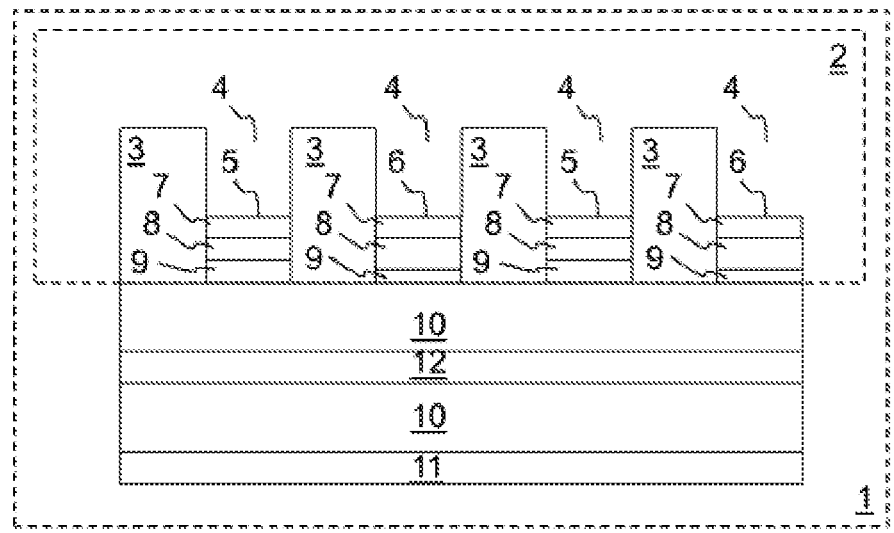
FIG. 1: is a schematic cross-sectional view of a first embodiment of a laser having a device for injecting spin-polarized electrons and for reflecting light.

FIG. 1 is a schematic cross-sectional view of a first embodiment of a laser 1 having a device 2 for injecting spin-polarized electrons and for reflecting light. The laser 1 preferably has semiconductor materials, such that the laser 1 can also be referred to as a semiconductor laser and/or as a laser diode. The laser 1 shown in FIG. 1 is a preferred embodiment of an arrangement which comprises the described device. The arrangement can generally be a light-emitting component having a resonator. In addition to a laser, this can also be a resonant LED, for example. The arrangement can in particular be referred to as a "device with cavity."

Laser light can be generated with the laser 1 by recombining electrons and holes in an active region 12 of the laser 1. During the recombination, a photon is created by the energy released. The active region 12 can in particular be designed as a p-n-junction. The laser light is generated at the junction between a p-doped region and an n-doped region. For example, p-GaAs and n-GaAs come into consideration as material for the active region 12. The wavelength of the laser light generated by the laser 1 can be determined by the choice of the material and/or the doping of the material of the active region 12.

The photons generated in the active region 12 are reflected by a mirror 11 arranged below the active region 12 and by the device 2 arranged above the active region 12, which serves in particular for reflecting light. According to the laser principle, this reflection of the generated photons can lead to the induced emission of further photons. Thereby, laser light is created in the active region 12. The arrangement of the device 2 above the active region 12 and the mirror 11 below the active region 12 is exemplary. The arrangement 1 can be oriented as desired. In particular, the device 2 can also be arranged below the active region 12 and the mirror 11 can be arranged above the active region 12.

The mirror 11 is preferably designed as a Bragg mirror. A so-called Distributed Bragg Reflector (DBR) is particularly suitable. The Bragg mirror preferably comprises a plurality of layers which, in their entirety, reflect the light generated. The layers are preferably formed from semiconductor material. The materials are preferably chosen such that layers having a first refractive index and a second refractive index alternate. For example, layers of GaAs and AlGaAs can be arranged alternately. The layer thickness is preferably equal to a quarter of the wavelength of the light to be reflected in all layers, such that the reflection of the light can take place in the manner of the Bragg reflection. Alternatively, the mirror can also be designed as a metal mirror.

The device 2 comprises at least one lattice structure 3 having a plurality of recesses 4. In the embodiment described here, this is arranged on the active region 12 and opposite the mirror 11 such that the lattice structure at least partially reflects photons that are generated in the active region back into the active region. In interaction with the opposite mirror, i.e. the mirror 11, the lattice structure thus forms a laser resonator. FIG. 1 shows four recesses 4 which are formed between parts of the lattice structure 3. The lattice structure 3 is preferably designed with a semiconductor material and/or with a metal.

Figure 2:
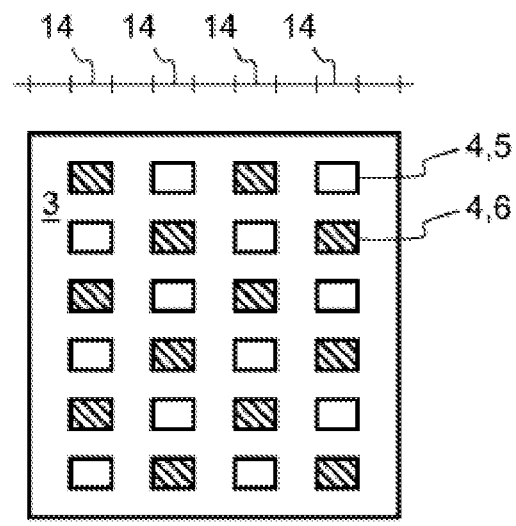
FIG. 2: is a schematic plan view of the laser of FIG. 1, and FIG. 3: is a schematic cross-sectional view of a second embodiment of a laser having a device for injecting spin-polarized electrons and for reflecting light.

As can be seen from the top view of the laser 1 from FIG. 1 shown in FIG. 2, the lattice structure 3 is rectangular in one embodiment. This means that the recesses 4 are rectangular and are arranged and aligned along straight, perpendicular, or parallel lines. The recesses 4 preferably all have the same shape and/or extension. The distances between adjacent recesses are preferably all the same size.

The smaller the recesses 4, the better the light can be reflected on the lattice structure 3. It is preferred that the length 14 of the recesses 4 in the lattice structure 3 is less than the wavelength of the light to be reflected and in particular less than half the wavelength of the light to be reflected. The length 14 of the recesses 4 is to be understood as the largest extension of the recesses 4 within a plane transverse to the lattice structure 3. This is the level shown in FIG. 2. With such small recesses 4 in the lattice structure 3, the light can be reflected particularly well.

The lattice structure can also be designed differently than shown in the figures. It is particularly considered that the lattice structure is only one-dimensional. This means that the recesses are arranged in only one direction along parallel lines, while no recesses are provided in a direction transverse to this direction. Such an embodiment can also be described in that the number of lattice periods in one direction is one. It is also possible that the lattice structure is not designed at right angles, but in annular structures.

The active region 12, the mirror 11, and the device 2 are preferably designed as solid bodies having a respective crystal lattice structure. The crystal lattice structure is to be distinguished from the lattice structure 3 described here. The lattice structures of the active region 12, the mirror 11, and the device 2 can be different. In particular, in order to avoid tension caused by such a lattice mismatch, a respective matching layer 10 can be provided between the active region 12 and the mirror 11 and/or between the active region 12 and the device 2, as shown in the example of FIG. 1. The matching layers 10 are preferably formed from semiconductor material. The matching layers 10 can in particular also be referred to as a "phase-matching layer." If the injection of electrons into the active region is described, this also means the injection of electrons through the matching layer 10 into the active region 12 if a matching layer 10 is present. Photons generated in the active region 12 pass through the matching layer 10 before reflection at the mirror 11, are then reflected at the mirror 11, pass through the matching layer 10 again, such that the photons get back into the active region 12.

The matching layer 10 together with the active region 12 forms the resonator of the laser and has an overall optical thickness n*d, which preferably corresponds approximately to the emission wavelength. The position of the active region 12 is also not necessarily in the center of the resonator.

The matching layers 10 need not be clearly separated from the active region 12, from the device 2, and/or from the mirror 11. It is also possible for there to be a smooth junction between a matching layer 10 and the device 2, the active region 12 and/or the mirror 11. If no matching layer 10 is provided, the active region 12 can also flow smoothly into the device 2 and/or into the mirror 11. For example, the mirror 11 can also have a doping which contributes to the generation of the laser light.

Alternatively, it is preferred that the matching layers 10 are clearly separated from the active region 12, from the device 2, and/or from the mirror 11. If no matching layers 10 are provided, it is preferred that the active region 12 is clearly separated from the device 2 and/or from the mirror 11.

The device 2 is also designed and set up to inject electrons into the active region 12. The electrons can in particular be spin-polarized. This means that the spin orientation of the injected electrons is not evenly distributed between the two possible spin states "Up" and "Down," but that one of the spin states predominates. The entirety of the injected electrons is thus spin-polarized in this spin state. In the laser 1 described, the spin polarization of the charge carrier system, that is to say the electrons, can be used to influence the polarization of the light generated and thus a light property. The polarization of the light can be influenced in particular by building up and breaking down the spin polarization. For this purpose, it is possible, for example, to switch between up and down spin or between spin-polarized and unpolarized cases. The spin-polarized electrons can be injected into the active region 12 through injection contacts 5, 6 and optionally via the matching layer 10. For this purpose, a respective injection contact 5, 6 is arranged at least in some of the recesses 4 of the lattice structure 3. As shown in the example in FIG. 1, a respective injection contact 5, 6 is preferably arranged in each of the recesses 4.

The injection contacts 5, 6 can—as shown in the example in FIG. 1—have a respective metallic layer 7. The metallic layer 7 can be formed, for example, with gold, chromium, and/or aluminum. The injection contacts 5, 6 can be contacted via the metallic layers 7, for example via corresponding supply lines. All injection contacts 5, 6 can be contacted together. Alternatively, individual injection contacts 5, 6 or groups of injection contacts 5, 6 can be contacted individually. The metallic layer 7 can also serve to protect underlying layers. In this respect, the metallic layer 7 can also be referred to as a "cap layer."

At least some of the injection contacts 5, 6 preferably comprise a respective ferromagnetic layer 8. All injection contacts 5, 6 preferably comprise a respective ferromagnetic layer 8. A layer structure composed of a plurality of sublayers can be used as the ferromagnetic layer 8. Such a layer structure is to be understood here as a ferromagnetic layer 8. For example, the ferromagnetic layer 8 can be designed as a multilayer sequence of Fe/Tb, Fe/Pt, Co/Pt, and/or Co/Ni or as an alloy, for example with FeTb and/or CoFeB. The ferromagnetic layer 8 can be formed, for example, with iron and/or terbium.

Electrons can be polarized by the ferromagnetic layer 8. If non-spin-polarized electrons are introduced into the ferromagnetic layer 8, the magnetization of the ferromagnetic layer 8 can preferably allow electrons of one spin orientation to pass through and retain the electrons of the other spin orientation. In a simplified model, this can be described by the fact that a ferromagnetic layer 8 has different ohmic resistances for the electrons of the two spin orientations.

It is preferred that the ferromagnetic layer 8 has a magnetization which is oriented perpendicular to the ferromagnetic layer 8. Such magnetization can also be referred to as "out-of-plane" magnetization. In particular in the case of multi-layer systems or mixed systems composed of rare earth and transition metal, such an oriented magnetization can be set particularly easily. An "out-of-plane" magnetization can occur spontaneously with a layer that is appropriately dimensioned, particularly with regard to the layer thickness. A permanent external magnetic field can thus be dispensed with, which improves the practical usability of the laser 1.

It is further preferred that at least some of the injection contacts 5, 6 comprise a respective tunnel barrier 9. All injection contacts 5, 6 preferably comprise a respective tunnel barrier 9. The tunnel barrier 9 can in particular be formed of an oxide, such as MgO or $Al_2O_3$. Spin injection from the ferromagnetic layer 8 into the active region 12 of the laser 1 can lead to a considerable loss of spin polarization, in particular at the interface between the ferromagnetic layer 8 and an adjacent semiconductor material. The semiconductor material can in particular be part of the active region 12 or the matching layer 10. Such a loss of spin polarization can be due in particular to a large difference between the electrical conductivity of ferromagnetic material and semiconductor material. Such a loss of spin polarization can be reduced or avoided entirely by a tunnel barrier 9.

As an alternative or in addition to a tunnel barrier 9, the intrinsic properties of the materials used can also be used to form a barrier. It is preferred that at least some of the injection contacts 5, 6 of the device 2 are designed as a respective Schottky contact. The formation of the injection contacts 5, 6 as Schottky contacts can depend on the material properties of the adjacent semiconductor material, for example the matching layer 10 or the active region 12, in particular on its band structure. In this respect, the Schottky contacts in the device 2 described are formed when the device 2 is used for a specific laser 1.

All injection contacts 5, 6 are preferably designed as Schottky contacts. Alternatively, it is preferred that all injection contacts 5, 6 have a respective tunnel barrier 9. However, it is also possible for only some of the injection contacts 5, 6 to have a tunnel barrier 9, for another part of the injection contacts 5, 6 to be designed as a Schottky contact, and/or for another part of the injection contacts 5, 6 to have no barrier.

Spin-polarized electrons can be injected into the active region 12 of the laser 1 through the injection contacts 5, 6. Holes can, for example, be injected via one or more mating contacts into the active region 12. The mating contact is not shown in the figures. A metal electrode is particularly suitable as a mating contact.

By injecting the spin-polarized electrons into the active region 12, polarized light can be generated there. The path between the injection contacts 5, 6 and the active region 12 can be particularly short in the laser 1 described because the electrons are injected through one of the reflectors of the laser 1 and thus very close to the active region 12. In the embodiment described here, the spin-polarized electrons then only have to pass through the thickness of the matching layer in order to reach the active region 12. The distance from a spin-polarized electron to the active region is thus considerably shorter than with conventional arrangements. A short path between injection and light generation can prevent a spin polarization of the electrons from being lost before the active region 12 is reached. If the spin polarization were lost before reaching the active region 12, no polarized light could be generated with these electrons. The path that the electrons can travel with the loss of 50% of the original spin polarization is referred to here as the spin-relaxation length. The distance between the injection contacts 5, 6 and the active region 12 is preferably smaller than the spin-relaxation length. The spin-relaxation length can depend in particular on a temperature and/or a magnetic field strength. Due to the small distance between the injection contacts 5, 6 and the active region 12, the temperature at which the laser is operated can be selected to be comparatively high, because a comparatively small spin-relaxation length is sufficient to transfer the electron into the active region while maintaining the spin polarization. It is thus possible to use the laser 1 described even at temperatures and magnetic field strengths which are significantly easier to obtain than, for example, a few 10 mK at a plurality of Tesla. For example, the laser 1 can be used at room temperature and without an external magnetic field.

The laser 1 can in particular be operated using a method in which spin-polarized electrons are injected into the active region 12 of the laser 1 via the injection contacts 5, 6 and in which the polarization of the laser light generated by the laser 1 is controlled by means of the spin polarization of the electrons. The laser light generated in this way can be used in particular for the transmission of information. The information can be encoded by the polarization of the electrons and consequently by the polarization of the light generated by the laser 1.

A specific polarization of the generated light can be obtained by a specific spin polarization of the injected electrons. The embodiment shown in FIG. 1 comprises injection contacts 5, 6 of different designs. First injection contacts 5 can have a first magnetic field direction and thus generate and inject spin-up electrons. Second injection contacts 6 then have a magnetic field direction that is opposite to the magnetic field orientation of the first injection contacts, such that spin-down electrons can be generated and injected. This allows the entire charge carrier system, i.e. the electrons, to be switched between up and down spin. This results in right or left circular light emission. Alternatively, as shown in the example in FIG. 3, injection contacts 5 or 6 and metal contacts 13 can be used. Either spin-up or spin-down electrons are injected through the injection contacts 5 or 6, which cause the respective spin polarization in the charge carrier system. The same number of spin-up and spin-down electrons can be injected through the metal contacts 13, as a result of which the spin polarization in the charge carrier system is reduced. Furthermore, more than two different contact types can also be used, for example. What has been said for the first embodiment and for the second embodiment can be applied to such embodiments.

In order to be able to change the spin polarization of the electrons, first injection contacts 5 and second injection contacts 6 are arranged in an alternating arrangement in the embodiment shown in FIG. 1. The first injection contacts 5 are designed for the injection of electrons having a first spin polarization and the second injection contacts 6 are designed for the injection of electrons having a second spin polarization different from the first spin polarization. In particular, all first injection contacts 5 can be connected together to a first power supply line and all second injection contacts 6 to a second power supply line. The number of electrons injected through the injection contacts 5, 6 can be set by means of a current intensity impressed on the respective power supply line. If only current is applied to the first lead, then only electrons with the first spin polarization are injected, such that light is generated with a first polarization. If only current is applied to the second lead, only electrons are injected with the second spin polarization, such that light is generated with a second polarization. If current is applied to the first supply line with a first current intensity and is applied to the second supply line with a second current intensity, the polarization obtained can be adjusted by the ratio of the operating points of the two contacts. The alternating arrangement of the first injection contacts 5 and the second injection contacts 6 means that a second injection contact 6 follows at least in one direction after a first injection contact 5. A second injection contact 6 preferably follows a first injection contact 5 in each direction. This is the case in the example shown in FIG. 2. Such an alternating arrangement allows electrons of different polarization to be injected into the active region 12 in a uniformly distributed manner.

The first injection contacts 5 and the second injection contacts 6 are preferably designed differently from one another in such a way that the magnetizations are oriented opposite to one another and the first spin polarization is thereby opposite to the second spin polarization. This can be achieved in particular by opposing magnetization of the ferromagnetic layers 8 of the injection contacts 5, 6.

For the generation of the first injection contacts 5 and the second injection contacts 6, the ferromagnetic layers 8 are preferably created in such a way that they have an out-of-plane magnetization. This can be achieved, for example, with a multilayer structure. After the growth of the ferromagnetic layers 8, magnetic domains are preferably oriented within the ferromagnetic layers 8 by an external magnetic field that is applied to this step of the manufacturing process of the laser 1. The magnetic domains in the ferromagnetic layers 8 remain aligned in the corresponding direction after the external magnetic field has been switched off. The magnetization of the ferromagnetic layers 8 can be adjusted depending on the direction of the external magnetic field. It can be exploited that the magnetization characteristic is a hysteresis curve. It follows from the hysteresis curve that a remagnetization of the corresponding ferromagnetic layer 8 requires a minimum magnetic field—the coercive field strength.

For the first injection contacts 5 and the second injection contacts 6 to have ferromagnetic layers 8 with opposite magnetization, the ferromagnetic layers 8 preferably have different coercive field strengths in the two types of injection contacts 5, 6, such that the hysteresis curves are preferably of different widths. By applying, for example, an external positive and then a negative field, differently aligned magnetizations or magnetization directions can be impressed on the two types of injection contacts 5, 6. In this way, a higher magnetic field can first be applied in a first direction, such that the ferromagnetic layers 8 of both types of injection contacts 5, 6 are magnetized in the first direction. A weaker magnetic field aligned in a second direction opposite to the first direction can then be applied, which only remagnetizes the ferromagnetic layers 8 of the injection contacts 5 or 6 with the narrower hysteresis curve, while the ferromagnetic layers 8 of the other injection contacts 5 or 6 remain unchanged.

The width of the hysteresis curve depends, for example, on the spatial extension of the ferromagnetic layer 8, such that different hysteresis curves can be obtained by different dimensions of the injection contacts 5, 6. The embodiment in FIG. 1 shows that the ferromagnetic layer 8 in the first injection contacts 5 is thinner than in the second injection contacts 6, while the tunnel barrier 9 in the first injection contacts 5 is thicker than in the second injection contacts 6. Different coercive field strengths can be obtained through different layer thicknesses of the ferromagnetic layer 8, such that the ferromagnetic layers 8 of the different injection contacts 5, 6 can be magnetized in opposite directions.

Alternatively or additionally, different material combinations can have different hysteresis curves, such that the two types of injection contacts 5, 6 can be brought about by different materials.

An alternative possibility for the different magnetization of both types of injection contacts having the same material and the same dimensions is an optomagnetic approach. Both types of injection contacts are initially magnetized equally. An opposing magnetic field having a weaker field strength is then applied in such a way that the hysteresis is not run through, but the material is only about to remagnetize. Now, with the help of a focused laser, the contact regions of only one contact type can be scanned, such that the material heats up briefly in precisely these regions, while the regions of the other contact type are not heated. As a result of the heating, the hysteresis curve of the material shifts such that the external magnetic field already applied is sufficient for remagnetizing, such that the magnetization of the heated contacts is aligned in this way and these subsequently have a magnetization opposite to the first direction of magnetization. A device obtained by the optomagnetic procedure can in particular have injection contacts 5, 6 which, with the exception of the different magnetizations, are identical to one another.

Figure 3:
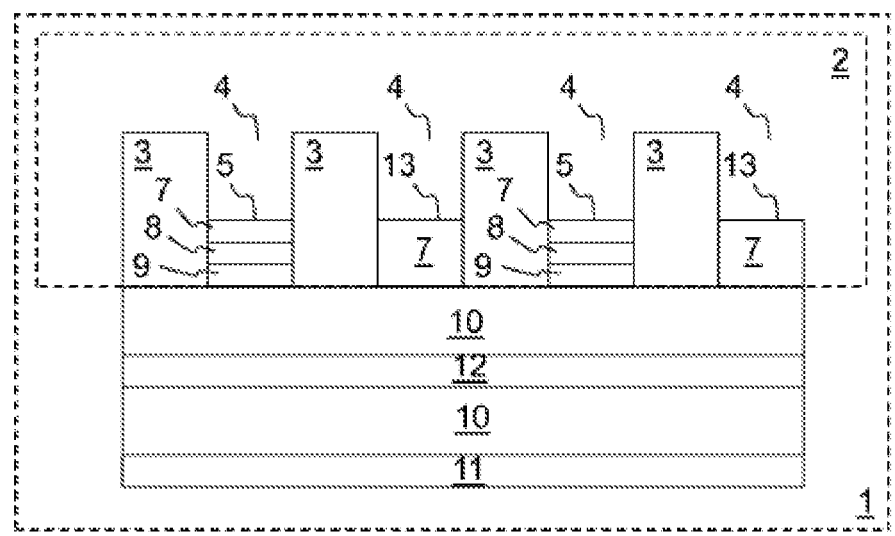

FIG. 3 is a schematic cross-sectional view of a second embodiment of a laser 1 having a device 2 for injecting spin-polarized electrons and for reflecting light. The second embodiment is identical to the first embodiment except for the differences described below.

In the second embodiment, only first injection contacts 5 and also metal contacts 13 are arranged in the recesses 4, such that injection contacts 5, 6 are not arranged in all recesses 4 of the lattice structure 3. The metal contacts 13 are used to inject electrons without spin polarization. In this embodiment, electrons having a first spin polarization can be injected via the first injection contacts 5 and electrons without spin polarization can be injected via the metal contacts 13. In contrast, in the first embodiment, electrons with the first spin polarization can be injected via the first injection contacts 5 and electrons with the second spin polarization 6 can be injected via the second injection contacts. In one embodiment, zero spin polarization can be achieved with simple metal contacts 13 that have no magnetization. A tunnel barrier 9 is not required for the metal contacts 13.

The manufacture of the second embodiment is simplified compared to the first embodiment because only injection contacts 5 of one type have to be magnetized, while the metal contacts 13 do not require any aftertreatment.

In the described method for operating the arrangement, in particular the laser, it is preferred that the resonance frequency of the arrangement, which forms a polarization modulation system, is influenced and in particular maximized with the aid of birefringence. It is further preferred that the influenced and in particular maximized resonance frequency of the polarization modulation system is used for example for optical data transmission.

LIST OF REFERENCE NUMERALS 1 arrangement
2 device
3 lattice structure
4 recess
5 first injection contact
6 second injection contact
7 metallic layer
8 ferromagnetic layer
9 tunnel barrier
10 matching layer
11 mirror
12 active region
13 metal contact
14 extension

We claim:

1. A Device for injecting spin-polarized electrons and for reflecting light, comprising at least one lattice structure having a plurality of recesses, wherein the lattice structure is designed to reflect the light, and wherein a respective injection contact for injecting spin-polarized charge carriers is arranged in at least some of the recesses;
an arrangement of an active region; and
a mirror with the device,
wherein the mirror and the device are arranged for reflecting light into the active region.

2. The Device according to claim 1, wherein first injection contacts and second injection contacts are arranged in an alternating arrangement, and wherein the first injection contacts are designed for the injection of electrons having a first spin polarization and the second injection contacts are designed for the injection of electrons having a second spin polarization different from the first spin polarization.

3. The Device according to claim 1, wherein metal contacts are further provided in some of the recesses for injecting electrons without spin polarization.

4. The Device according to claim 1, wherein a length of the recesses in the lattice structure is smaller than a wavelength of the light to be reflected.

5. The Device according to claim 1, wherein at least some of the injection contacts comprise a respective ferromagnetic layer.

6. The Device according to claim 5, wherein the ferromagnetic layer has a magnetization which is oriented perpendicular to the ferromagnetic layer.

7. The Device according to claim 1, wherein at least some of the injection contacts comprise a respective tunnel barrier.

8. The Device of claim 1, wherein at least some of the injection contacts of the device are designed as a respective Schottky contact.

9. A Method for operating the device of claim 8, wherein spin-polarized electrons are injected via the injection contacts into the active region of the arrangement, and wherein a polarization of the light generated by the arrangement is influenced by the spin polarization of the electrons.

10. The Device according to claim 2 wherein metal contacts are further provided in some of the recesses for injecting electrons without spin polarization.

11. The Device according to claim 2, wherein a length of the recesses in the lattice structure is smaller than a wavelength of the light to be reflected.

12. The Device according to claim 3, wherein a length of the recesses in the lattice structure is smaller than a wavelength of the light to be reflected.

13. The Device according to claim 2, wherein at least some of the injection contacts comprise a respective ferromagnetic layer.

14. The Device according to claim 3, wherein at least some of the injection contacts comprise a respective ferromagnetic layer.

15. The Device according to claim 4, wherein at least some of the injection contacts comprise a respective ferromagnetic layer.

16. The Device according to claim 2, wherein at least some of the injection contacts comprise a respective tunnel barrier.

17. The Device according to claim 3, wherein at least some of the injection contacts comprise a respective tunnel barrier.

18. The Device according to claim 4 wherein at least some of the injection contacts comprise a respective tunnel barrier.

19. The Device of claim 2, further comprising an active region, a mirror, wherein the mirror and the device are arranged for reflecting light into the active region.

* * * * *